(12) United States Patent
Hasko et al.

(10) Patent No.: US 7,838,778 B1
(45) Date of Patent: Nov. 23, 2010

(54) CIRCUIT BOARD LAYOUT

(75) Inventors: Meir Hasko, Misgav (IL); Dan Azeroual, Kiryat Ata (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 668 days.

(21) Appl. No.: 11/706,021

(22) Filed: Feb. 14, 2007

Related U.S. Application Data

(60) Provisional application No. 60/795,112, filed on Apr. 26, 2006.

(51) Int. Cl.
 *H05K 3/34* (2006.01)
 *H05K 1/11* (2006.01)
 *H01R 12/04* (2006.01)

(52) U.S. Cl. ......................................... 174/262; 29/840

(58) Field of Classification Search ......... 174/262–266; 361/792–795; 29/840
 See application file for complete search history.

(56) References Cited

U.S. PATENT DOCUMENTS

| | | | |
|---|---|---|---|
| 6,388,890 B1 | 5/2002 | Kwong et al. | |
| 6,407,344 B1 * | 6/2002 | Horiuchi et al. | 174/261 |
| 6,762,366 B1 | 7/2004 | Miller et al. | |
| 6,891,260 B1 | 5/2005 | Mora et al. | |

FOREIGN PATENT DOCUMENTS

| | | |
|---|---|---|
| EP | 0 921 567 A2 | 11/1998 |
| EP | 0 928 029 A2 | 12/1998 |
| EP | 1 075 026 A2 | 8/2000 |

\* cited by examiner

*Primary Examiner*—Jeremy C Norris

(57) ABSTRACT

A circuit board having a method therefor comprises a first circuit board layer comprising a first surface having disposed thereon a first plurality of lands arranged in three rows and comprising at least one group of the lands, wherein each group of the lands comprises first and second ones of the lands arranged in a first one of the rows, third, fourth, and fifth ones of the lands arranged in a second one of the rows, and sixth and seventh ones of the lands arranged in a third one of the rows, wherein the second one of the rows is adjacent to, and lies between, the first one of the rows and the third one of the rows; and respective traces extending from the first, second, third, fourth, fifth, and sixth ones of the lands between the sixth and seventh ones of the lands.

25 Claims, 7 Drawing Sheets

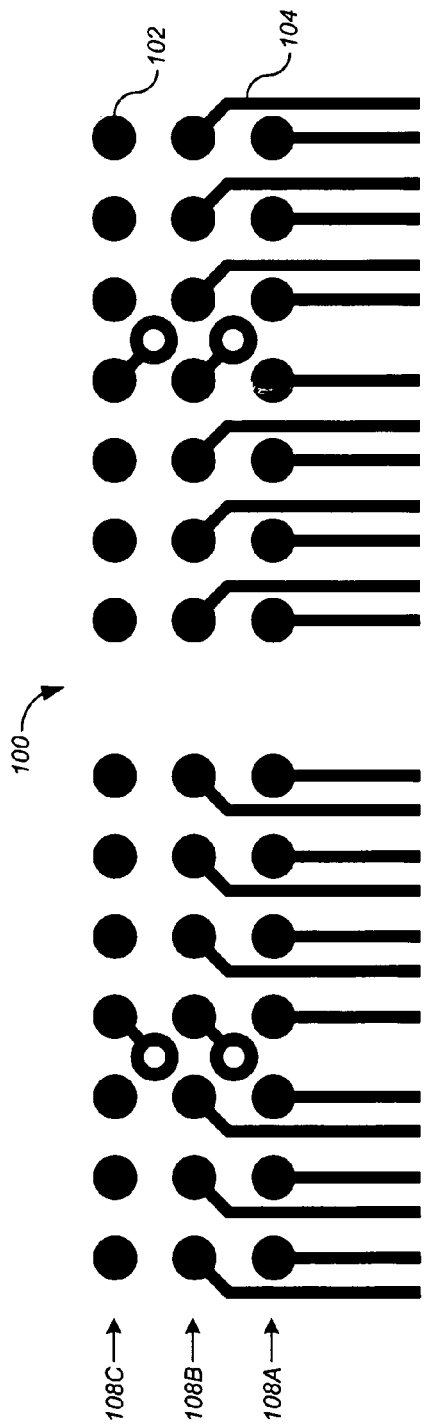
FIG. 1 - PRIOR ART
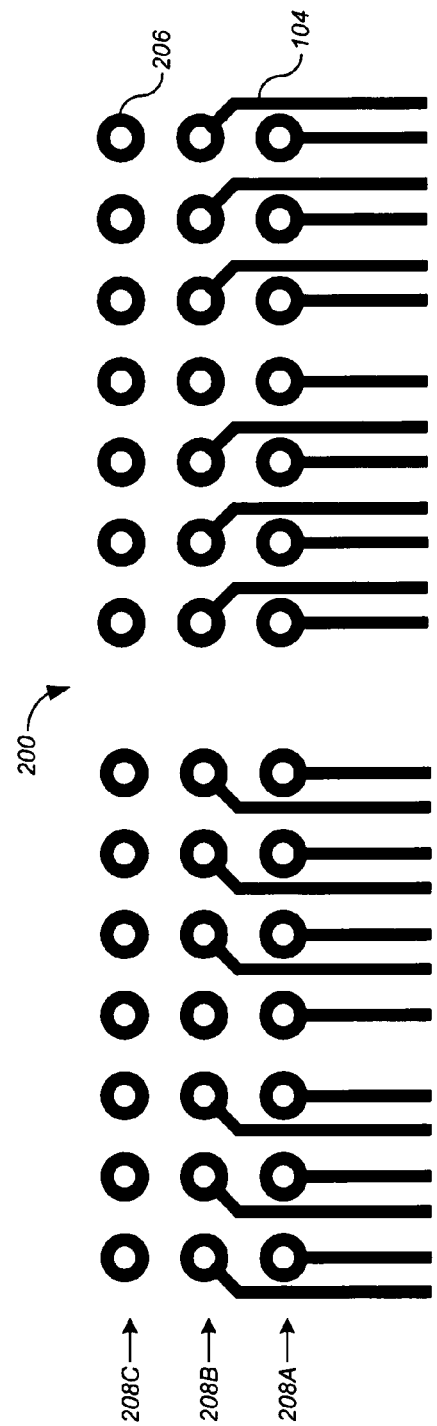
FIG. 2 - PRIOR ART

CIRCUIT BOARD LAYOUT

CROSS-REFERENCE TO RELATED APPLICATIONS

This application claims the benefit of U.S. Provisional Patent Application Ser. No. 60/795,112 filed on Apr. 26, 2006, the disclosure thereof incorporated by reference herein in its entirety.

BACKGROUND

The present invention relates generally to circuit boards. More particularly, the present invention relates to circuit board layout.

Modern integrated circuits have attained a complexity that requires a large number of terminals for connection to other devices. To reduce the package size of such integrated circuits, the terminals are generally arranged in multiple rows on the underside of the package, for example in what is referred to as a "ball grid array" (BGA). These terminals, referred to as "balls," are then connected to contacts called "lands" on the surface of the circuit boards. Connections called "traces" connect the lands to other devices or terminals on the circuit board.

To reduce package footprint, the balls on the integrated circuit package are generally placed as close together as possible, as are the lands on the circuit board.

FIG. 1 shows a top circuit board layer 100 for a prior art circuit board comprising three rows 108A-C of lands 102. As can be seen in FIG. 1, lands 102 are generally so close together that only one trace 104 can pass between adjacent lands 102. In fact, as can be seen in the arrangement of FIG. 1, there is no room for traces 104 to be connected to the lands 102 in the third row 108C. Instead, a second circuit board layer is required. The lands 102 in the third (and higher) rows must be connected to vias, which penetrate circuit board layer 100 to connect to traces on other circuit board layers.

A similar limitation occurs for internal layers of prior art circuit boards. FIG. 2 shows an internal circuit board layer 200 of a prior art circuit board comprising three rows 208A-C of vias 206. As can be seen in FIG. 2, vias 206 are also generally so close together that only one trace 104 can pass between adjacent vias 206. In fact, as can be seen in the arrangement of FIG. 2, there is no room for traces 104 to be connected to the vias 206 in the third row 208C. Instead, a further circuit board layer is required. The vias 206 in the third (and higher) rows penetrate circuit board layer 200 to connect to traces on other internal circuit board layers.

As can be seen in FIGS. 1 and 2, a device having many rows of balls requires several circuit board layers. In addition, power and ground plane layers are required for each circuit board layer. These many layers increase the complexity and cost of the circuit boards.

SUMMARY

In general, in one aspect, the invention features a circuit board comprising: a first circuit board layer comprising a first surface having disposed thereon a first plurality of lands arranged in three rows and comprising at least one group of the lands, wherein each group of the lands comprises first and second ones of the lands arranged in a first one of the rows, third, fourth, and fifth ones of the lands arranged in a second one of the rows, and sixth and seventh ones of the lands arranged in a third one of the rows, wherein the second one of the rows is adjacent to, and lies between, the first one of the rows and the third one of the rows; and respective traces extending from the first, second, third, fourth, fifth, and sixth ones of the lands between the sixth and seventh ones of the lands.

In some embodiments, each of the groups of the lands further comprises: a first column of the lands comprising the third and sixth ones of the lands; a second column of the lands comprising the first and fourth ones of the lands; and a third column of the lands comprising the second, fifth and seventh ones of the lands; wherein the second column of the lands is adjacent to, and lies between, the first and third columns of the lands. Some embodiments comprise a second circuit board layer comprising a second surface having disposed thereon a plurality of vias arranged in three rows and comprising at least one group of the vias, wherein each group of the vias comprises first and second ones of the vias arranged in a first one of the rows, third, fourth, and fifth ones of the vias arranged in a second one of the rows, and sixth and seventh ones of the vias arranged in a third one of the rows, wherein the second one of the rows is adjacent to, and lies between, the first one of the rows and the third one of the rows; and respective traces extending from the first, second, third, fourth, fifth, and sixth ones of the vias between the sixth and seventh ones of the vias. In some embodiments, each of the groups of the vias further comprises: a first column of the vias comprising the third and sixth ones of the vias; a second column of the vias comprising the first and fourth ones of the vias; and a third column of the vias comprising the second, fifth and seventh ones of the vias; wherein the second column of the vias is adjacent to, and lies between, the first and third columns of the vias. In some embodiments, the lands disposed upon the first surface of the first circuit board layer further comprise: a second plurality of lands arranged in three rows; wherein each of the vias is electrically coupled to one of the second plurality of lands.

In general, in one aspect, the invention features a circuit board comprising: first circuit board layer means for supporting comprising a first surface having disposed thereon first plurality of first means for electrically contacting arranged in three rows and comprising at least one group of the first means for electrically contacting, wherein each group of the first means for electrically contacting comprises first and second ones of the first means for electrically contacting arranged in a first one of the rows, third, fourth, and fifth ones of the first means for electrically contacting arranged in a second one of the rows, and sixth and seventh ones of the first means for electrically contacting arranged in a third one of the rows, wherein the second one of the rows is adjacent to, and lies between, the first one of the rows and the third one of the rows; and respective means for electrically connecting extending from the first, second, third, fourth, fifth, and sixth ones of the first means for electrically contacting between the sixth and seventh ones of the first means for electrically contacting. In some embodiments, each of the groups of the first means for electrically contacting further comprises: a first column of the first means for electrically contacting comprising the third and sixth ones of the first means for electrically contacting; a second column of the first means for electrically contacting comprising the first and fourth ones of the first means for electrically contacting; and a third column of the first means for electrically contacting comprising the second, fifth and seventh ones of the first means for electrically contacting; wherein the second column of the first means for electrically contacting is adjacent to, and lies between, the first and third columns of the first means for electrically contacting. Some embodiments comprise second circuit board layer means for supporting comprising a second surface having disposed thereon a plurality of second means for electrically contacting arranged in three rows and comprising at least one group of the second means for electrically contacting, wherein each of the second means for electrically contacting penetrates the second circuit board layer means, and wherein each group of the second means for electrically contacting comprises first and second ones of the second means for electrically contacting arranged in a first one of the rows, third, fourth, and fifth ones of the second means for electrically contacting arranged in a second one of the rows, and sixth and seventh ones of the second means for electrically contacting arranged in a third one of the rows, wherein the second one of the rows is adjacent to, and lies between, the first one of the rows and the third one of the rows; and respective means for electrically connecting extending from the first, second, third, fourth, fifth, and sixth ones of the second means for electrically contacting between the sixth and seventh ones of the second means for electrically contacting. In some embodiments, each of the groups of the second means for electrically contacting further comprises: a first column of the second means for electrically contacting comprising the third and sixth ones of the second means for electrically contacting; a second column of the second means for electrically contacting comprising the first and fourth ones of the second means for electrically contacting; and a third column of the second means for electrically contacting comprising the second, fifth and seventh ones of the second means for electrically contacting; wherein the second column of the second means for electrically contacting is adjacent to, and lies between, the first and third columns of the second means for electrically contacting. In some embodiments, the first means for electrically contacting disposed upon the first surface of the first circuit board layer further comprise: a second plurality of first means for electrically contacting arranged in three rows; wherein each of the second means for electrically contacting is electrically coupled to one of the second plurality of first means for electrically contacting.

In general, in one aspect, the invention features method comprising: providing a first circuit board layer comprising a first surface; disposing, upon the first surface of the first circuit board layer, a plurality of lands arranged in three rows and comprising at least one group of the lands, wherein each group of the lands comprises first and second ones of the lands arranged in a first one of the rows, third, fourth, and fifth ones of the lands arranged in a second one of the rows, and sixth and seventh ones of the lands arranged in a third one of the rows, wherein the second one of the rows is adjacent to, and lies between, the first one of the rows and the third one of the rows; and respective traces extending from the first, second, third, fourth, fifth, and sixth ones of the lands between the sixth and seventh ones of the lands.

In some embodiments, each of the groups of the lands further comprises: a first column of the lands comprising the third and sixth ones of the lands; a second column of the lands comprising the first and fourth ones of the lands; and a third column of the lands comprising the second, fifth and seventh ones of the lands; wherein the second column of the lands is adjacent to, and lies between, the first and third columns of the lands. Some embodiments comprise providing a second circuit board layer comprising a second surface; disposing, upon the second surface of the second circuit board layer, a plurality of vias arranged in three rows and comprising at least one group of the vias, wherein each group of the vias comprises first and second ones of the vias arranged in a first one of the rows, third, fourth, and fifth ones of the vias arranged in a second one of the rows, and sixth and seventh ones of the vias arranged in a third one of the rows, wherein the second one of the rows is adjacent to, and lies between, the first one of the rows and the third one of the rows; and respective traces extending from the first, second, third, fourth, fifth, and sixth ones of the vias between the sixth and seventh ones of the vias. In some embodiments, each of the groups of the vias further comprises: a first column of the vias comprising the third and sixth ones of the vias; a second column of the vias comprising the first and fourth ones of the vias; and a third column of the vias comprising the second, fifth and seventh ones of the vias; wherein the second column of the vias is adjacent to, and lies between, the first and third columns of the vias. In some embodiments, the lands disposed upon the first surface of the first circuit board layer further comprise: a second plurality of lands arranged in three rows; wherein each of the vias is electrically coupled to one of the second plurality of lands.

In general, in one aspect, the invention features a multi-layer circuit board comprising: a first circuit board layer comprising a first surface having disposed thereon a plurality of lands, and respective first traces extending from the lands; and a second circuit board layer comprising a second surface having disposed thereon a plurality of vias arranged in three rows and comprising at least one group of the vias, wherein each group of the vias comprises first and second ones of the vias arranged in a first one of the rows, third, fourth, and fifth ones of the vias arranged in a second one of the rows, and sixth and seventh ones of the vias arranged in a third one of the rows, wherein the second one of the rows is adjacent to, and lies between, the first one of the rows and the third one of the rows, and respective second traces extending from the first, second, third, fourth, fifth, and sixth ones of the vias between the sixth and seventh ones of the vias.

In some embodiments, each of the groups of the vias further comprises: a first column of the vias comprising the third and sixth ones of the vias; a second column of the vias comprising the first and fourth ones of the vias; and a third column of the vias comprising the second, fifth and seventh ones of the vias; wherein the second column of the vias is adjacent to, and lies between, the first and third columns of the vias. In some embodiments, at least one of the lands is electrically coupled to at least one of the vias.

In general, in one aspect, the invention features multi-layer circuit board comprising: first circuit board layer means for supporting comprising a first surface having disposed thereon a plurality of first means for electrically contacting, and respective first means for electrically connecting extending from the first means for electrically contacting; and a second circuit board layer comprising a second surface having disposed thereon a plurality of second means for electrically contacting arranged in three rows and comprising at least one group of the second means for electrically contacting, wherein each group of the second means for electrically contacting comprises first and second ones of the second means for electrically contacting arranged in a first one of the rows, third, fourth, and fifth ones of the second means for electrically contacting arranged in a second one of the rows, and sixth and seventh ones of the second means for electrically contacting arranged in a third one of the rows, wherein the second one of the rows is adjacent to, and lies between, the first one of the rows and the third one of the rows, and respective second means for electrically connecting extending from the first, second, third, fourth, fifth, and sixth ones of the second means for electrically contacting between the sixth and seventh ones of the second means for electrically contacting.

In some embodiments, each of the groups of the second means for electrically contacting further comprises: a first column of the second means for electrically contacting comprising the third and sixth ones of the second means for electrically contacting; a second column of the second means for electrically contacting comprising the first and fourth ones of the second means for electrically contacting; and a third column of the second means for electrically contacting comprising the second, fifth and seventh ones of the second means for electrically contacting; wherein the second column of the second means for electrically contacting is adjacent to, and lies between, the first and third columns of the second means for electrically contacting. In some embodiments, at least one of the first means for electrically contacting is electrically coupled to at least one of the second means for electrically contacting.

In general, in one aspect, the invention features a method comprising: providing a first circuit board layer comprising a first surface; disposing, upon the first surface of the first circuit board layer, a plurality of lands, and respective first traces extending from the lands; providing a second circuit board layer comprising a second surface; disposing, upon the second surface of the second circuit board layer, a plurality of vias arranged in three rows and comprising at least one group of the vias, wherein each group of the vias comprises first and second ones of the vias arranged in a first one of the rows, third, fourth, and fifth ones of the vias arranged in a second one of the rows, and sixth and seventh ones of the vias arranged in a third one of the rows, wherein the second one of the rows is adjacent to, and lies between, the first one of the rows and the third one of the rows, and respective second traces extending from the first, second, third, fourth, fifth, and sixth ones of the vias between the sixth and seventh ones of the vias; and electrically coupling at least one of the lands to at least one of the vias.

In some embodiments, each of the groups of the vias further comprises: a first column of the vias comprising the third and sixth ones of the vias; a second column of the vias comprising the first and fourth ones of the vias; and a third column of the vias comprising the second, fifth and seventh ones of the vias; wherein the second column of the vias is adjacent to, and lies between, the first and third columns of the vias.

The details of one or more implementations are set forth in the accompanying drawings and the description below. Other features will be apparent from the description and drawings, and from the claims.

DESCRIPTION OF DRAWINGS

FIG. 1 shows a top circuit board layer for a prior art circuit board.

FIG. 2 shows an internal circuit board layer of a prior art circuit board.

Figure 3A:
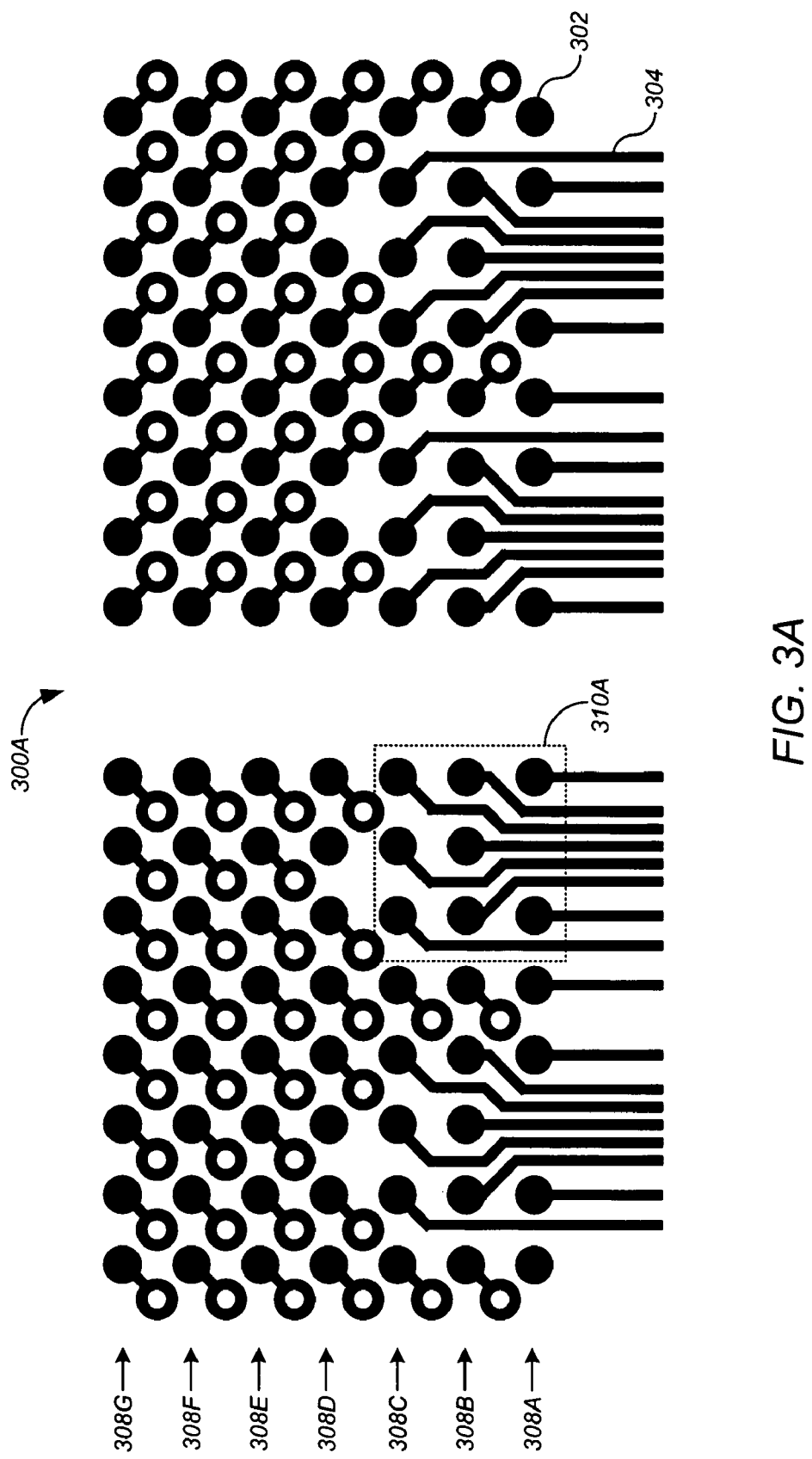
FIGS. 3A-C show three circuit board layers, respectively, for a multi-layer circuit board according to embodiments of the present invention.

The leading digit(s) of each reference numeral used in this specification indicates the number of the drawing in which the reference numeral first appears.

DETAILED DESCRIPTION

Embodiments of the present invention provide circuit boards having land and/or via arrangements that reduce the number of circuit board layers compared to prior art arrangements. According to embodiments of the present invention, certain lands (and vias) are omitted from certain rows to accommodate traces from other rows, thereby permitting a higher number of rows of lands (and vias) to be used on each circuit board layer.

Figure 3B:
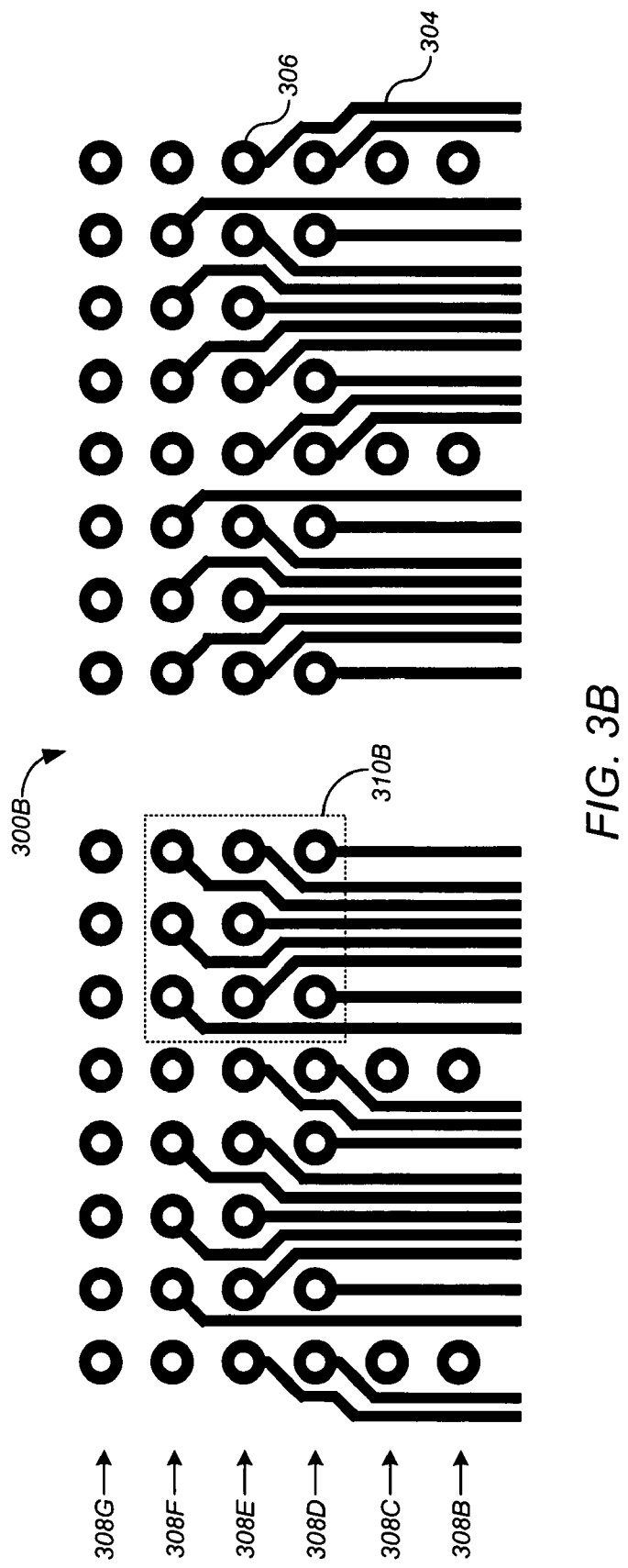
Figure 3C:
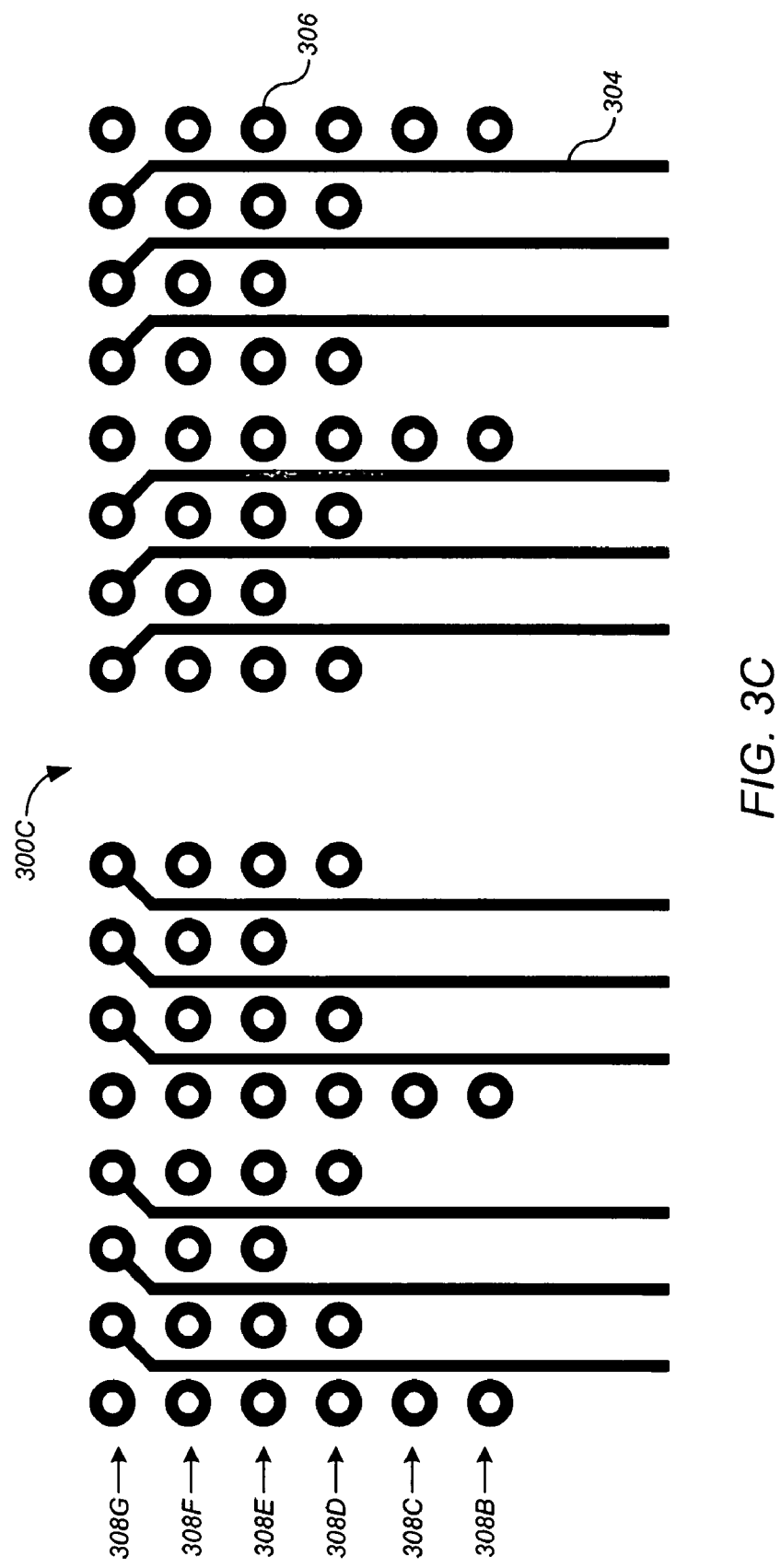

FIGS. 3A-C show three circuit board layers 300A-C, respectively, for a multi-layer circuit board 300 according to embodiments of the present invention. Circuit board layers 300A-C comprise lands 302, traces 304, and vias 306. Each circuit board layer 300A-C is capable of supporting traces 304 for three rows of lands 302 (for top layer 300A) or three rows of vias 306 (for internal layers 300B-C). Multi-layer circuit board 300 of FIG. 3 has seven rows 308A-G of lands 302, and uses only three circuit board layers 300A-C for traces 304. Of course, other embodiments may provide other numbers of layers, as will be apparent to one skilled in the relevant arts based on the disclosure and teachings provided herein.

In some embodiments, for a 1 mm BGA package pitch, each land 302 has a diameter of approximately 20 mils, each via 306 has a diameter of approximately 23 mils, the distance between the centers of two adjacent lands 302 or vias 306 in a row or column is approximately 20 mils, the width of each trace 304 is approximately 5 mils, and the minimum distance between traces 304 is approximately 5 mils. Of course, other embodiments may provide other dimensions, as will be apparent to one skilled in the relevant arts based on the disclosure and teachings provided herein.

Referring to FIG. 3A, top layer 300A includes seven rows 308A-G of lands, which of course will accommodate an integrated circuit package having seven rows of balls. Lands 302 in the outermost three rows 308A-C generally have traces 304 disposed upon top layer 300A, although some of the lands 302 in rows 308A-C can be connected to vias instead, as shown in FIG. 3A.

Lands in the remaining four rows 308D-G are generally connected to vias 306, which can be connected to traces in inner layers 300B-C. According to embodiments of the present invention, each layer 300A-C can support traces for three rows 308 of lands 302 (or vias 306). Therefore, referring to FIG. 3B, vias 306 in rows 308D-F are generally connected to traces 304 on inner layer 300B. Similarly, referring to FIG. 3C, vias 306 in row 308G are generally connected to traces 304 on inner layer 300C.

Figure 4:
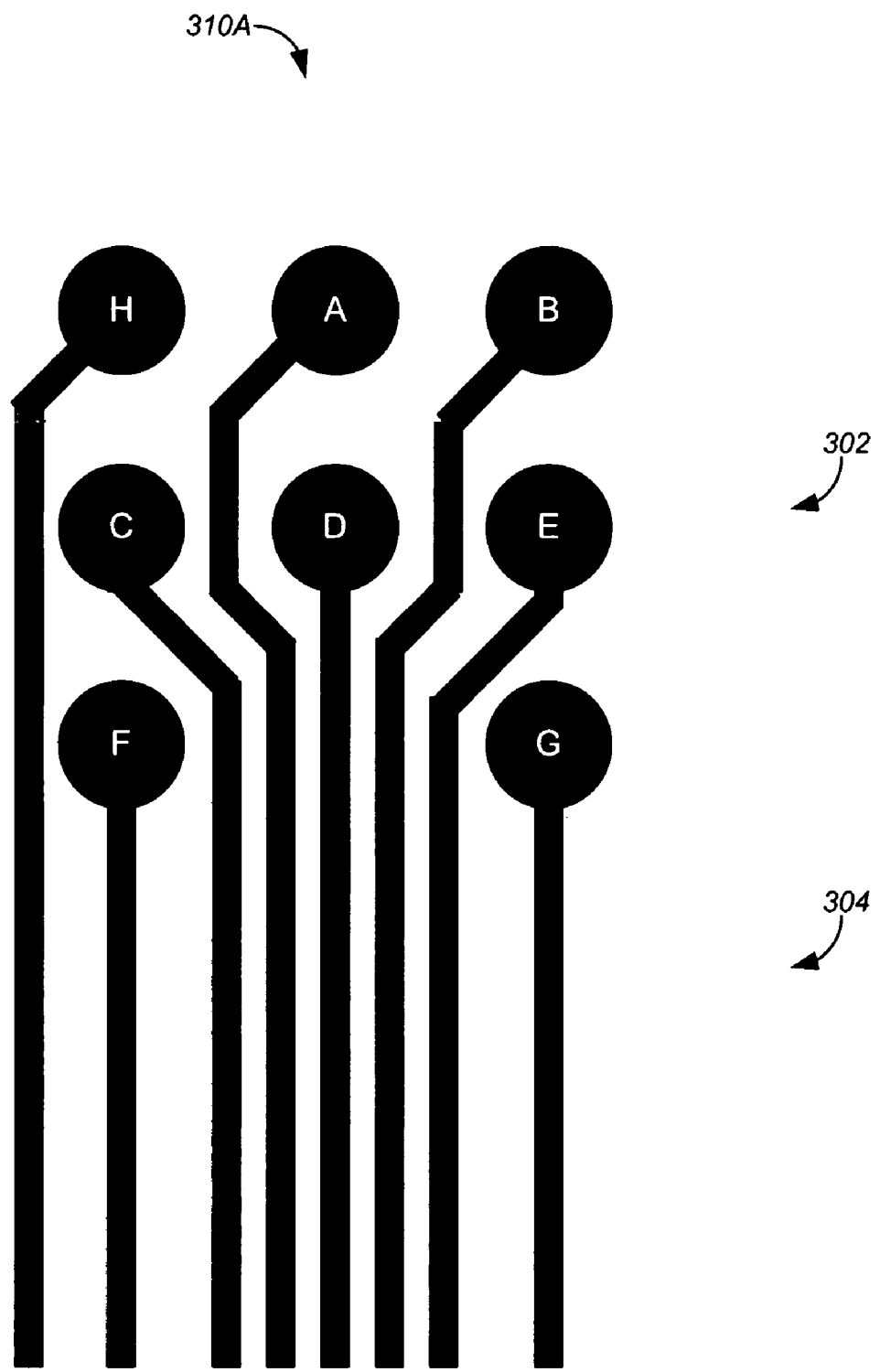
FIG. 4 shows a group of lands from a top layer of the circuit board of FIG. 3 according to embodiments of the present invention.

Each layer 300A-C of circuit board 300 includes one or more groups 310 of lands 302 (or vias 306) arranged to have an omitted land 302 (or via 306) to allow room for traces 304 from other lands 302 (or vias 306) in the group. FIG. 4 shows one such group 310A from top layer 300A of circuit board 300.

Group 310A includes eight lands 302A-H (marked simply as A-H in FIG. 4) arranged in three adjacent rows and three adjacent columns, although land 302H is not required. Lands 302A-B are arranged in the innermost row, lands 302C-E are arranged in the middle row, and lands 302F-G are arranged in the outermost row. In embodiments of the present invention, a land 302 is omitted between the lands 302F and 302G in the outermost row, thereby creating space for traces 304 from the other lands 302A-E to pass between lands 302F and 302G.

Figure 5:
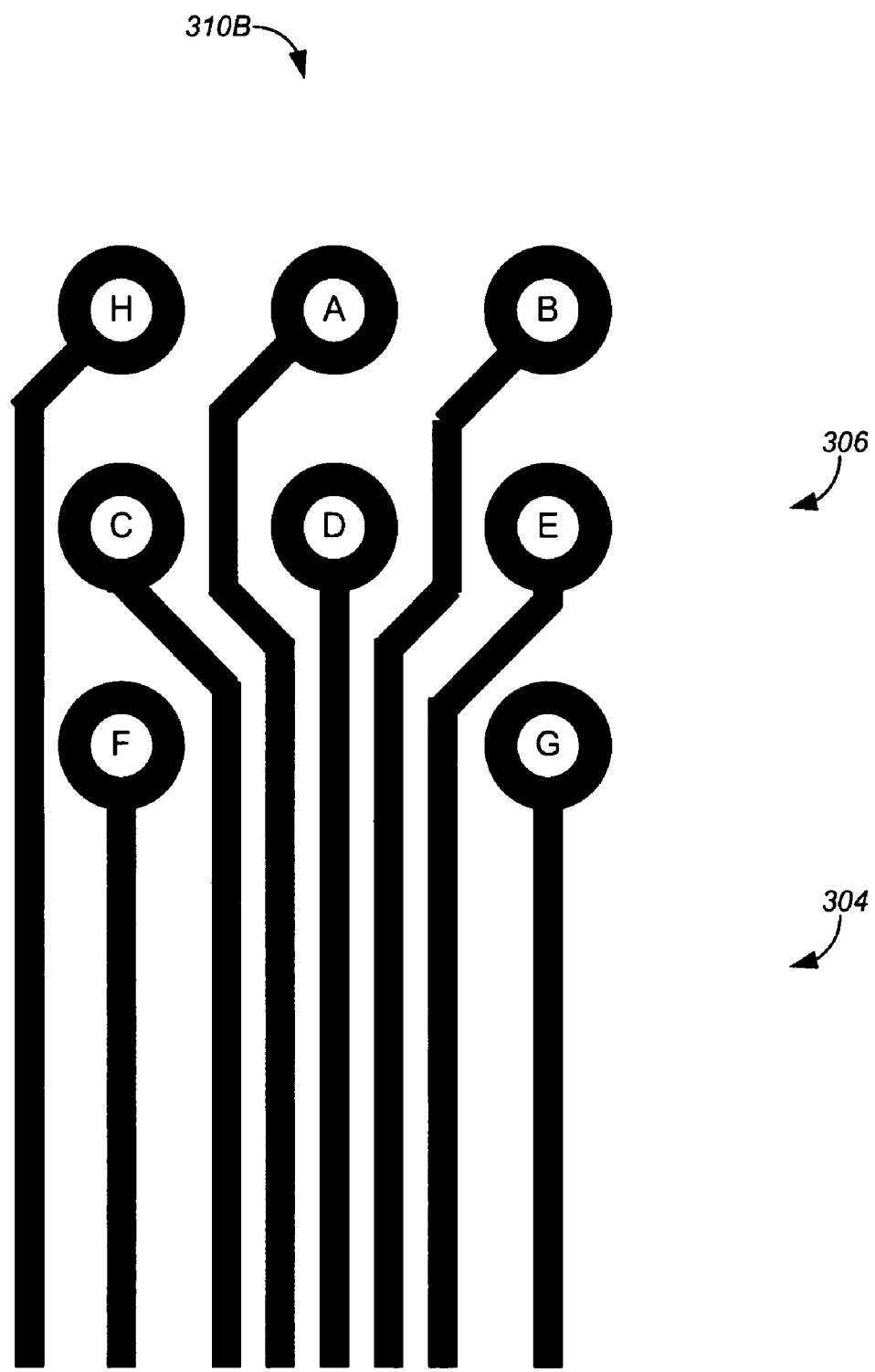
FIG. 5 shows a group of vias from an inner layer of the circuit board of FIG. 3 according to embodiments of the present invention.

FIG. 5 shows a corresponding group 310B of vias 306 from inner layer 300B of circuit board 300. Group 310B includes eight vias 306A-H (marked simply as A-H in FIG. 5) arranged in three adjacent rows and three adjacent columns, although via 306H is not required. Vias 306A-B are arranged in the innermost row, vias 306C-E are arranged in the middle row, and vias 306F-G are arranged in the outermost row. In embodiments of the present invention, a via 306 is omitted between the vias 306F and 306G in the outermost row, thereby creating space for traces 304 from the other vias 306A-E to pass between vias 306F and 306G.

Figure 6:
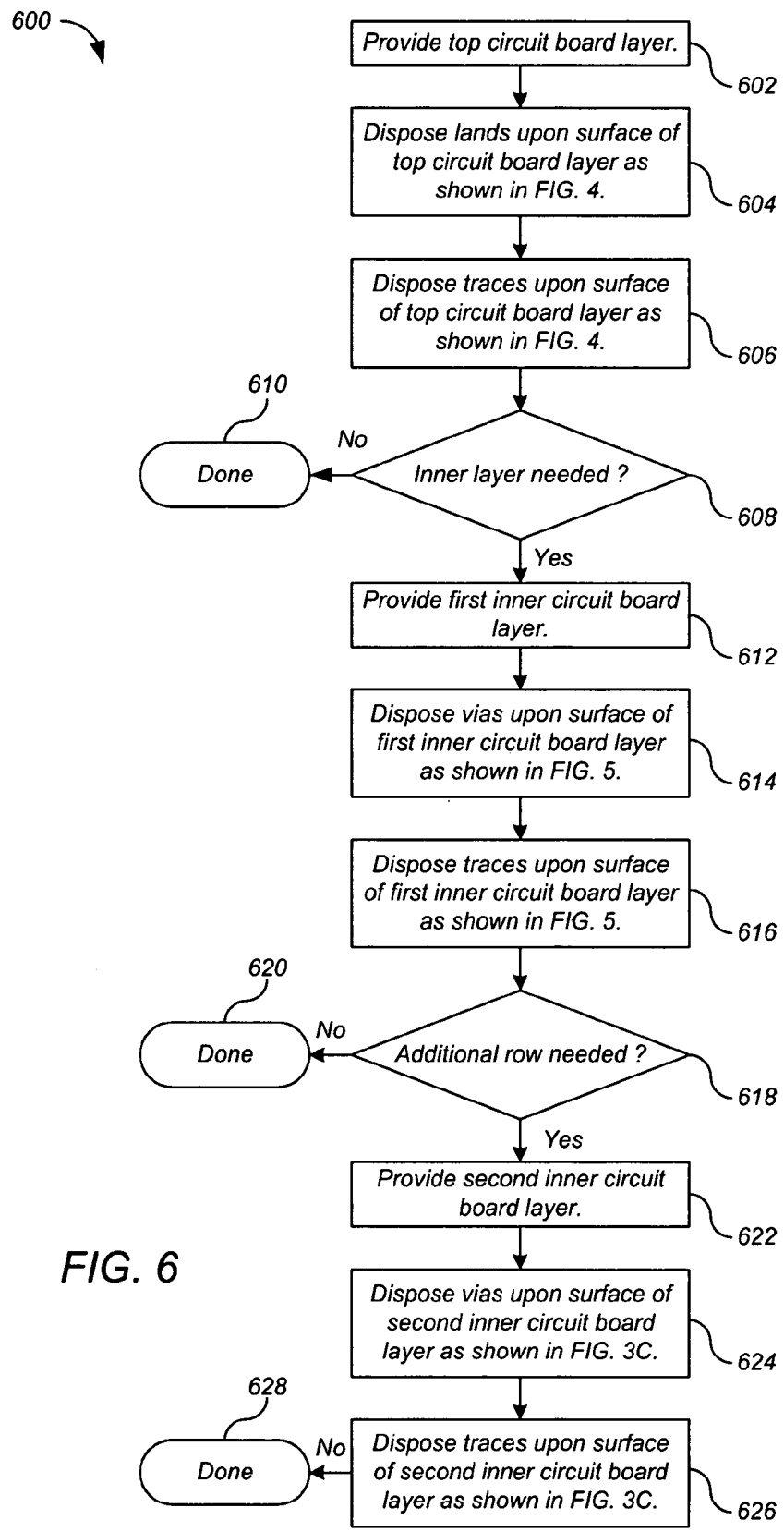
FIG. 6 shows a process for fabricating the multi-layer circuit board of FIG. 3 according to embodiments of the present invention.

FIG. 6 shows a process 600 for fabricating one or more layers of a multi-layer circuit board such as multi-layer circuit board 300 of FIG. 3 according to embodiments of the present invention. Although in the described embodiments, the elements of process 600 are presented in one arrangement, other embodiments may feature other arrangements, as will be apparent to one skilled in the relevant arts based on the disclosure and teachings provided herein. For example, the top layer of the circuit board can be fabricated according to conventional techniques, while one or more inner layers are fabricated according to embodiments of the present invention.

Process 600 provides a top circuit board layer 300A (step 602). Process 600 disposes, upon the surface of the circuit board layer, a plurality of lands 302 including one or more groups 310A of the lands 302 arranged as shown in FIG. 4 (step 604) and respective traces arranged as shown in FIG. 4 (step 606).

If no inner layers are needed (step 608), process 600 is done (step 610). But if one or more inner layers are needed (step 608), process 600 provides one or more further inner circuit board layers (step 612). For example, referring to FIG. 3B, process 600 provides a first inner circuit board layer 300B. Process 600 disposes, upon the surface of first inner circuit board layer 300B, a plurality of vias 306 including one or more groups 310B of the vias 306 arranged as shown in FIG. 5 (step 614) and respective traces 304 arranged as shown in FIG. 5 (step 616).

If no additional rows of contacts are needed (step 618), for example because fewer than seven rows of contacts are needed, process 600 is done (step 620), with only two circuit board layers providing six rows of contacts. But if an additional (seventh) row of contacts is needed, referring to FIG. 3C, process 600 provides a second inner circuit board layer 300C (step 622). Process 600 disposes, upon the surface of second inner circuit board layer 300C, a plurality of vias 306 (step 624) and respective traces 304 (step 626), for example arranged as shown in FIG. 3C. Then process 600 is done (step 628).

A number of implementations of the invention have been described. Nevertheless, it will be understood that various modifications may be made without departing from the spirit and scope of the invention. For example, while the arrangement of lands 302 shown in FIG. 4 is ideal for the top layer in a multi-layer circuit board, the arrangement can also be used for the only layer in a single-layer circuit board. Accordingly, other implementations are within the scope of the following claims.

What is claimed is:

1. A circuit board comprising:
   a first circuit board layer comprising a first surface having disposed thereon:
      a first plurality of lands arranged in three rows and comprising at least one group of the lands,
         wherein each group of the lands comprises:
            first and second ones of the lands arranged in a first one of the rows;
            third, fourth, and fifth ones of the lands arranged in a second one of the rows; and
            sixth and seventh ones of the lands arranged in a third one of the rows,
            wherein the second one of the rows is adjacent to, and lies between, the first one of the rows and the third one of the rows; and
         respective traces extending from the first, second, third, fourth, and fifth ones of the lands between the sixth and seventh ones of the lands,
         wherein:
            the third one of the lands and the sixth one of the lands are in a first column of the lands; and
            the seventh one of the lands and at least one of the second one of the lands and the fifth one of the lands are in a second column of the lands.

2. The circuit board of claim 1, wherein each of the groups of the lands further comprises third column of the lands comprising the first and fourth ones of the lands, and
   wherein:
      the second column of the lands comprises the second, fifth and seventh ones of the lands; and
      the third column of the lands is adjacent to, and lies between, the first and second columns of the lands.

3. The circuit board of claim 1, further comprising:
   a second circuit board layer comprising a second surface having disposed thereon:
      a plurality of vias arranged in three rows and comprising at least one group of the vias, wherein each group of the vias comprises:
         first and second ones of the vias arranged in a first one of the rows;
         third, fourth, and fifth ones of the vias arranged in a second one of the rows; and
         sixth and seventh ones of the vias arranged in a third one of the rows,
      wherein the second one of the rows is adjacent to, and lies between, the first one of the rows and the third one of the rows; and
      respective traces extending from the first, second, third, fourth, and fifth ones of the vias between the sixth and seventh ones of the vias.

4. The circuit board of claim 3, wherein each of the groups of the vias further comprises:
   a first column of the vias comprising the third and sixth ones of the vias;
   a second column of the vias comprising the first and fourth ones of the vias; and
   a third column of the vias comprising the second, fifth and seventh ones of the vias,
   wherein the second column of the vias is adjacent to, and lies between, the first and third columns of the vias.

5. The circuit board of claim 3, wherein the lands disposed upon the first surface of the first circuit board layer further comprise second plurality of lands arranged in three rows,
   wherein each of the vias is electrically coupled to one of the second plurality of lands.

6. The circuit board of claim 1, wherein the fourth one of the lands is between the third one of the lands and the fifth one of the lands.

7. The circuit board of claim 1, wherein the first one of the lands and the fourth one of the lands are in a third column of the lands.

8. A circuit board comprising:
   first circuit board layer means for supporting comprising a first surface having disposed thereon:
      first plurality of first means for electrically contacting arranged in three rows and comprising at least one group of the first means for electrically contacting, wherein each group of the first means for electrically contacting comprises:
  first and second ones of the first means for electrically contacting arranged in a first one of the rows;
  third, fourth, and fifth ones of the first means for electrically contacting arranged in a second one of the rows; and
  sixth and seventh ones of the first means for electrically contacting arranged in a third one of the rows,
  wherein the second one of the rows is adjacent to, and lies between, the first one of the rows and the third one of the rows; and
  respective means for electrically connecting extending from the first, second, third, fourth, and fifth ones of the first means for electrically contacting between the sixth and seventh ones of the first means for electrically contacting,
  wherein:
    the third one of the first means and the sixth one of the first means are in a first column of the first means; and
    the seventh one of the first means and at least one of the second one of the first means and the fifth one of the first means are in a second column of the first means.

9. The circuit board of claim 8, wherein each of the groups of the first means for electrically contacting further comprises a third column of the first means for electrically contacting comprising the first and fourth ones of the first means for electrically contacting, and
  wherein:
    the second column of the first means for electrically contacting comprises the second, fifth and seventh ones of the first means for electrically contacting; and
    the third column of the first means for electrically contacting is adjacent to, and lies between, the first and second columns of the first means for electrically contacting.

10. The circuit board of claim 8, further comprising:
  second circuit board layer means for supporting comprising a second surface having disposed thereon:
    a plurality of second means for electrically contacting arranged in three rows and comprising at least one group of the second means for electrically contacting,
    wherein each of the second means for electrically contacting penetrates the second circuit board layer means, and
    wherein each group of the second means for electrically contacting comprises:
      first and second ones of the second means for electrically contacting arranged in a first one of the rows;
      third, fourth, and fifth ones of the second means for electrically contacting arranged in a second one of the rows; and
      sixth and seventh ones of the second means for electrically contacting arranged in a third one of the rows,
      wherein the second one of the rows is adjacent to, and lies between, the first one of the rows and the third one of the rows; and
      respective means for electrically connecting extending from the first, second, third, fourth, and fifth ones of the second means for electrically contacting between the sixth and seventh ones of the second means for electrically contacting.

11. The circuit board of claim 10, wherein each of the groups of the second means for electrically contacting further comprises:
  a first column of the second means for electrically contacting comprising the third and sixth ones of the second means for electrically contacting;
  a second column of the second means for electrically contacting comprising the first and fourth ones of the second means for electrically contacting; and
  a third column of the second means for electrically contacting comprising the second, fifth and seventh ones of the second means for electrically contacting,
  wherein the second column of the second means for electrically contacting is adjacent to, and lies between, the first and third columns of the second means for electrically contacting.

12. The circuit board of claim 10, wherein the first means for electrically contacting disposed upon the first surface of the first circuit board layer means further comprises a second plurality of first means for electrically contacting arranged in three rows,
  wherein each of the second means for electrically contacting is electrically coupled to one of the second plurality of first means for electrically contacting.

13. A method comprising:
  providing a first circuit board layer comprising a first surface;
  disposing upon the first surface of the first circuit board layer:
    a plurality of lands arranged in three rows and comprising at least one group of the lands,
    wherein each group of the lands comprises:
      first and second ones of the lands arranged in a first one of the rows;
      third, fourth, and fifth ones of the lands arranged in a second one of the rows; and
      sixth and seventh ones of the lands arranged in a third one of the rows,
      wherein the second one of the rows is adjacent to, and lies between, the first one of the rows and the third one of the rows; and
    respective traces extending from the first, second, third, fourth, and fifth ones of the lands between the sixth and seventh ones of the lands,
    wherein:
      the third one of the lands and the sixth one of the lands are arranged in a first column of the lands; and
      the seventh one of the lands and at least one of the second one of the lands and the fifth one of the lands are arranged in a second column of the lands.

14. The method of claim 13, wherein each of the groups of the lands further comprises a third column of the lands comprising the first and fourth ones of the lands, and
  wherein:
    the second column of the lands comprises the second, fifth and seventh ones of the lands; and
    the third column of the lands is adjacent to, and lies between, the first and second columns of the lands.

15. The method of claim 13, further comprising:
  providing a second circuit board layer comprising a second surface;
  disposing upon the second surface of the second circuit board layer:
    a plurality of vias arranged in three rows and comprising at least one group of the vias,
    wherein each group of the vias comprises:
      first and second ones of the vias arranged in a first one of the rows;
      third, fourth, and fifth ones of the vias arranged in a second one of the rows; and sixth and seventh ones of the vias arranged in a third one of the rows,
wherein the second one of the rows is adjacent to, and lies between, the first one of the rows and the third one of the rows; and
respective traces extending from the first, second, third, fourth, and fifth ones of the vias between the sixth and seventh ones of the vias.

16. The method of claim 15, wherein each of the groups of the vias further comprises:
a first column of the vias comprising the third and sixth ones of the vias;
a second column of the vias comprising the first and fourth ones of the vias; and
a third column of the vias comprising the second, fifth and seventh ones of the vias,
wherein the second column of the vias is adjacent to, and lies between, the first and third columns of the vias.

17. The method of claim 15, wherein the lands disposed upon the first surface of the first circuit board layer further comprise a second plurality of lands arranged in three rows, wherein each of the vias is electrically coupled to one of the second plurality of lands.

18. A multi-layer circuit board comprising:
a first circuit board layer comprising a first surface having disposed thereon:
a plurality of lands; and
respective first traces extending from the lands; and
a second circuit board layer comprising a second surface having disposed thereon:
a plurality of vias arranged in three rows and comprising at least one group of the vias, wherein each group of the vias comprises:
first and second ones of the vias arranged in a first one of the rows;
third, fourth, and fifth ones of the vias arranged in a second one of the rows; and
sixth and seventh ones of the vias arranged in a third one of the rows,
wherein the second one of the rows is adjacent to, and lies between, the first one of the rows and the third one of the rows; and
respective second traces extending from the first, second, third, fourth, and fifth ones of the vias between the sixth and seventh ones of the vias,
wherein:
the third one of the vias and the sixth one of the vias are in a first column of the vias; and
the seventh one of the vias and at least one of the second one of the vias and the fifth one of the vias are in a second column of the vias.

19. The multi-layer circuit board of claim 18, wherein each of the groups of the vias further comprises a third column of the vias comprising the first and fourth ones of the vias, and wherein:
the second column of the vias comprises the second, fifth and seventh ones of the vias; and
the third column of the vias is adjacent to, and lies between, the first and second columns of the vias.

20. The multi-layer circuit board of claim 18, wherein at least one of the lands is electrically coupled to at least one of the vias.

21. A multi-layer circuit board comprising:
first circuit board layer means for supporting comprising a first surface having disposed thereon:
a plurality of first means for electrically contacting; and
respective first means for electrically connecting extending from the first means for electrically contacting; and
a second circuit board layer comprising a second surface having disposed thereon:
a plurality of second means for electrically contacting arranged in three rows and comprising at least one group of the second means for electrically contacting, wherein each group of the second means for electrically contacting comprises:
first and second ones of the second means for electrically contacting arranged in a first one of the rows;
third, fourth, and fifth ones of the second means for electrically contacting arranged in a second one of the rows; and
sixth and seventh ones of the second means for electrically contacting arranged in a third one of the rows,
wherein the second one of the rows is adjacent to, and lies between, the first one of the rows and the third one of the rows; and
respective second means for electrically connecting extending from the first, second, third, fourth, and fifth ones of the second means for electrically contacting between the sixth and seventh ones of the second means for electrically contacting,
wherein:
the third one of the second means and the sixth one of the second means are in a first column of the second means; and
the seventh one of the second means and at least one of the second one of the second means and the fifth one of the second means are in a second column of the second means.

22. The multi-layer circuit board of claim 21, wherein each of the groups of the second means for electrically contacting further comprises a third column of the second means for electrically contacting comprising the first and fourth ones of the second means for electrically contacting, and
wherein:
the second column of the second means for electrically contacting comprises the second, fifth and seventh ones of the second means for electrically contacting; and
the third column of the second means for electrically contacting is adjacent to, and lies between, the first and second columns of the second means for electrically contacting.

23. The multi-layer circuit board of claim 21, wherein at least one of the first means for electrically contacting is electrically coupled to at least one of the second means for electrically contacting.

24. A method comprising:
providing a first circuit board layer comprising a first surface;
disposing upon the first surface of the first circuit board layer:
a plurality of lands; and
respective first traces extending from the lands;
providing a second circuit board layer comprising a second surface;

disposing upon the second surface of the second circuit board layer:
- a plurality of vias arranged in three rows and comprising at least one group of the vias, wherein each group of the vias comprises:
  - first and second ones of the vias arranged in a first one of the rows;
  - third, fourth, and fifth ones of the vias arranged in a second one of the rows; and
  - sixth and seventh ones of the vias arranged in a third one of the rows,
  - wherein the second one of the rows is adjacent to, and lies between, the first one of the rows and the third one of the rows; and
- respective second traces extending from the first, second, third, fourth, and fifth ones of the vias between the sixth and seventh ones of the vias; and electrically coupling at least one of the lands to at least one of the vias,
wherein:
- the third one of the lands and the sixth one of the lands are in a first column of the lands; and
- the seventh one of the lands and at least one of the second one of the lands and the fifth one of the lands are in a second column of the lands.

25. The method of claim 24, wherein each of the groups of the vias further comprises a third column of the vias comprising the first and fourth ones of the vias, and
wherein:
- the second column of the vias comprises the second, fifth and seventh ones of the vias; and
- the third column of the vias is adjacent to, and lies between, the first and second columns of the vias.

\* \* \* \* \*